(12) United States Patent
Takahashi

(10) Patent No.: US 12,301,235 B2
(45) Date of Patent: May 13, 2025

(54) SEMICONDUCTOR DEVICE

(71) Applicant: Mitsubishi Electric Corporation, Tokyo (JP)

(72) Inventor: Hajime Takahashi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 60 days.

(21) Appl. No.: 18/218,634

(22) Filed: Jul. 6, 2023

(65) Prior Publication Data
US 2024/0348237 A1    Oct. 17, 2024

(30) Foreign Application Priority Data

Apr. 11, 2023    (JP) .................................. 2023-063962

(51) Int. Cl.
*H03K 3/013*    (2006.01)
*H03K 3/012*    (2006.01)

(52) U.S. Cl.
CPC ............ *H03K 3/013* (2013.01); *H03K 3/012* (2013.01)

(58) Field of Classification Search
CPC .............................. H03K 3/013; H03K 3/012
See application file for complete search history.

(56) References Cited

U.S. PATENT DOCUMENTS

| | | | |
|---|---|---|---|
| 2009/0052211 A1* | 2/2009 | Asai ................ | H02M 7/5387 363/56.05 |
| 2020/0161973 A1* | 5/2020 | Fukushima ............ | H02M 1/08 |
| 2022/0069735 A1 | 3/2022 | Kumazawa | |

FOREIGN PATENT DOCUMENTS

JP      2022-041081 A    3/2022

* cited by examiner

*Primary Examiner* — Metasebia T Retebo
(74) *Attorney, Agent, or Firm* — Sughrue Mion, PLLC

(57) ABSTRACT

The semiconductor device includes: a first power module having a first reference potential terminal and a first control signal input terminal; a second power module, connected in parallel to the first power module, having a second reference potential terminal and a second control signal input terminal; a first capacitor connected between the first control signal input terminal and the first reference potential terminal; and a first filter connected in series to the first capacitor, on an inter-control terminal path extending from the first control signal input terminal through the first capacitor to the second control signal input terminal. The first filter has a frequency characteristic that an impedance thereof increases as a frequency increases.

18 Claims, 10 Drawing Sheets

SEMICONDUCTOR DEVICE

BACKGROUND OF THE INVENTION

1. Field of the Invention

The present disclosure relates to a semiconductor device.

2. Description of the Background Art

In recent years, a semiconductor device provided to a power conversion apparatus for an electric powertrain of a hybrid automobile, an electric automobile, or the like has been formed by a power module having a built-in switching element such as an insulated-gate bipolar transistor (IGBT) or a metal-oxide-semiconductor field-effect transistor (MOSFET). In the case of handling high power, a plurality of the switching elements or power modules are connected in parallel and simultaneously driven to be switched, whereby the capacity for handleable power is increased.

Each of the switching elements is operated by a drive circuit connected to a control signal input terminal thereof (for example, a gate terminal of the MOSFET). Switching speeds, i.e., a current change speed di/dt and a voltage change speed dv/dt, of such a switching element are determined according to a gate resistance of the drive circuit and parasitic capacitances of the switching element (for example, Cgs and Cgd of the MOSFET). In addition to these factors in determining the switching speeds, a gate capacitor is sometimes used for adjusting dv/dt. In general, the gate capacitor is connected to the control signal input terminal of the switching element and is used for the purpose of reducing switching loss or suppressing a steep change in voltage by adjusting dv/dt, for example.

However, in general, the gate capacitor is mounted on a control board along with the drive circuit, and thus a loop circuit is formed by, for example, a parasitic capacitance between the gate terminal and a source terminal of the MOSFET, the gate capacitor, wiring of the control board, and wiring of a terminal of the power module or the like. In this loop circuit, LC resonance or LC oscillation occurs. In addition, if a plurality of the modules are connected in parallel, passage through the gate capacitor leads to decrease in an impedance between gates of the respective modules, whereby a resonance or oscillation phenomenon between the modules occurs. If such electrical vibrations occur, control of the power conversion apparatus might be lost owing to an erroneous operation of a switching element, breakage of the switching element due to exceeding of a withstand voltage thereof, or breakage of a part on the control board.

As a technology of suppressing electrical vibrations in a semiconductor device provided with a gate capacitor, a technology has been proposed in which a switch that connects or disconnects a gate capacitor and a gate of a switching element is provided, and the gate capacitor and the gate of the switching element are disconnected at a timing at which the gate capacitor is unnecessary (see, for example, Patent Document 1).

Patent Document 1: Japanese Laid-Open Patent Publication No. 2022-41081

In a semiconductor device described in Patent Document 1, a circuit for controlling the switch that connects or disconnects the gate capacitor and the gate of the switching element needs to be provided, and control of operating the switch through determination of the desired timing so as to connect or disconnect the gate capacitor and the gate of the switching element needs to be performed. If a circuit for determining the desired timing or the circuit for controlling the switch performs an erroneous operation owing to noise, variation among parts, or the like, for example, connection performed at a timing at which disconnection is desired to be performed leads to occurrence of electrical vibrations, and meanwhile, disconnection performed at a timing at which connection is desired to be performed leads to failure to obtain the effects of the gate capacitor, whereby the switching speed of the switching element might take a value outside a designed range, excessive surge might occur, and the switching element might undergo withstand voltage breakdown. Thus, the difficulty of designing increases owing to the necessity to control the operation timing of the switch for connection and disconnection. Further, a problem arises in that a large-scale additional circuit including the switch that connects or disconnects the gate capacitor and the gate of the switching element and the control circuit that operates the switch through determination of the timing of connecting or disconnecting the gate capacitor, becomes necessary.

SUMMARY OF THE INVENTION

The present disclosure has been made to solve the above problems, and an object of the present disclosure is to provide a semiconductor device that suppresses, with a simple additional circuit, electrical vibrations occurring by an included gate capacitor.

A semiconductor device according to the present disclosure includes: a drive circuit which outputs a switching control signal from a gate voltage output terminal thereof; a first power module including therein a first semiconductor switching element and having a first reference potential terminal and a first control signal input terminal which receives the switching control signal; a second power module including therein a second semiconductor switching element and connected in parallel to the first power module, the second power module having a second reference potential terminal and a second control signal input terminal which receives the switching control signal; a first resistor connected between the gate voltage output terminal and the first control signal input terminal; a second resistor connected between the gate voltage output terminal and the second control signal input terminal; a first capacitor connected between the first control signal input terminal and the first reference potential terminal; a second capacitor connected between the second control signal input terminal and the second reference potential terminal; and a first filter connected in series to the first capacitor, on an inter-control terminal path extending from the first control signal input terminal through the first capacitor and the second capacitor to the second control signal input terminal, wherein the first filter has a frequency characteristic that an impedance thereof increases as a frequency increases.

The semiconductor device according to the present disclosure includes: a drive circuit which outputs a switching control signal from a gate voltage output terminal thereof; a first power module including therein a first semiconductor switching element and having a first reference potential terminal and a first control signal input terminal which receives the switching control signal; a second power module including therein a second semiconductor switching element and connected in parallel to the first power module, the second power module having a second reference potential terminal and a second control signal input terminal which receives the switching control signal; a first resistor connected between the gate voltage output terminal and the first control signal input terminal; a second resistor connected between the gate voltage output terminal and the second control signal input terminal; a first capacitor connected between the first control signal input terminal and the first reference potential terminal; a second capacitor connected between the second control signal input terminal and the second reference potential terminal; and a first filter connected in series to the first capacitor, on an inter-control terminal path extending from the first control signal input terminal through the first capacitor and the second capacitor to the second control signal input terminal, wherein the first filter has a frequency characteristic that an impedance thereof increases as a frequency increases. Thus, the semiconductor device can suppress, with a simple additional circuit, electrical vibrations occurring by an included gate capacitor.

DETAILED DESCRIPTION OF THE PREFERRED EMBODIMENTS OF THE INVENTION

Figure 1:
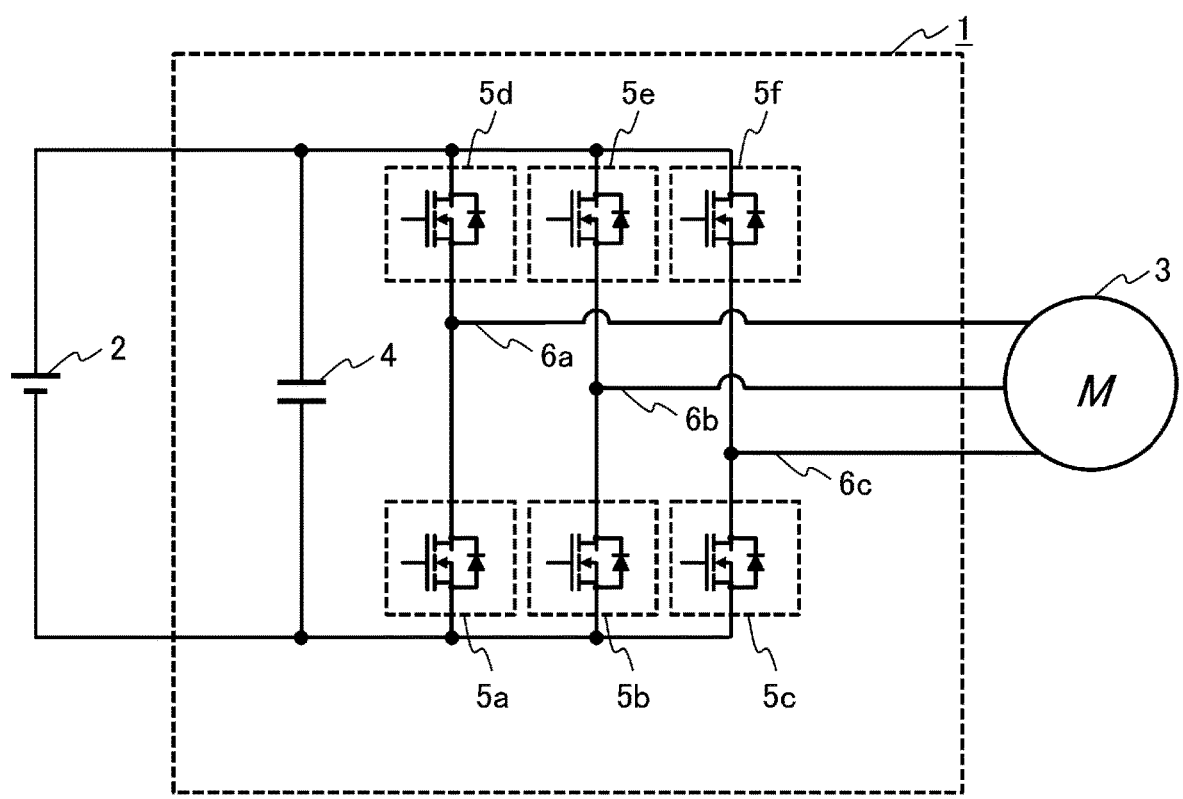
FIG. 1 is a schematic diagram of a power conversion apparatus in a first embodiment.

Hereinafter, semiconductor devices according to embodiments for carrying out the present disclosure will be described in detail with reference to the drawings. The same or corresponding constituents in the drawings are denoted by the same reference characters.

First Embodiment

FIG. 1 is a schematic diagram of a power conversion apparatus in a first embodiment. The power conversion apparatus in the first embodiment is an inverter circuit 1 for converting DC power into AC power. The inverter circuit 1 has: an input unit to which a DC power supply 2 is connected; and an output unit to which a motor 3 as a load is connected. Here, in a case where this power conversion apparatus is applied to an electric automobile or a hybrid automobile, the DC power supply 2 is a power storage device and is representatively a battery implemented by a secondary battery such as a nickel-hydrogen battery or a lithium-ion battery, and the voltage thereof is about 200 V to 1000 V. The inverter circuit 1 is a three-phase inverter provided with: a smoothing capacitor 4, in an input stage, for eliminating voltage ripple or noise; and semiconductor devices 5a, 5b, 5c, 5d, 5e, and 5f including semiconductor switching elements. The three-phase inverter converts power of the DC power supply 2 and outputs AC power from power output nodes 6a, 6b, and 6c to the motor 3 for driving drive wheels of the electric automobile or the hybrid automobile.

Figure 2:
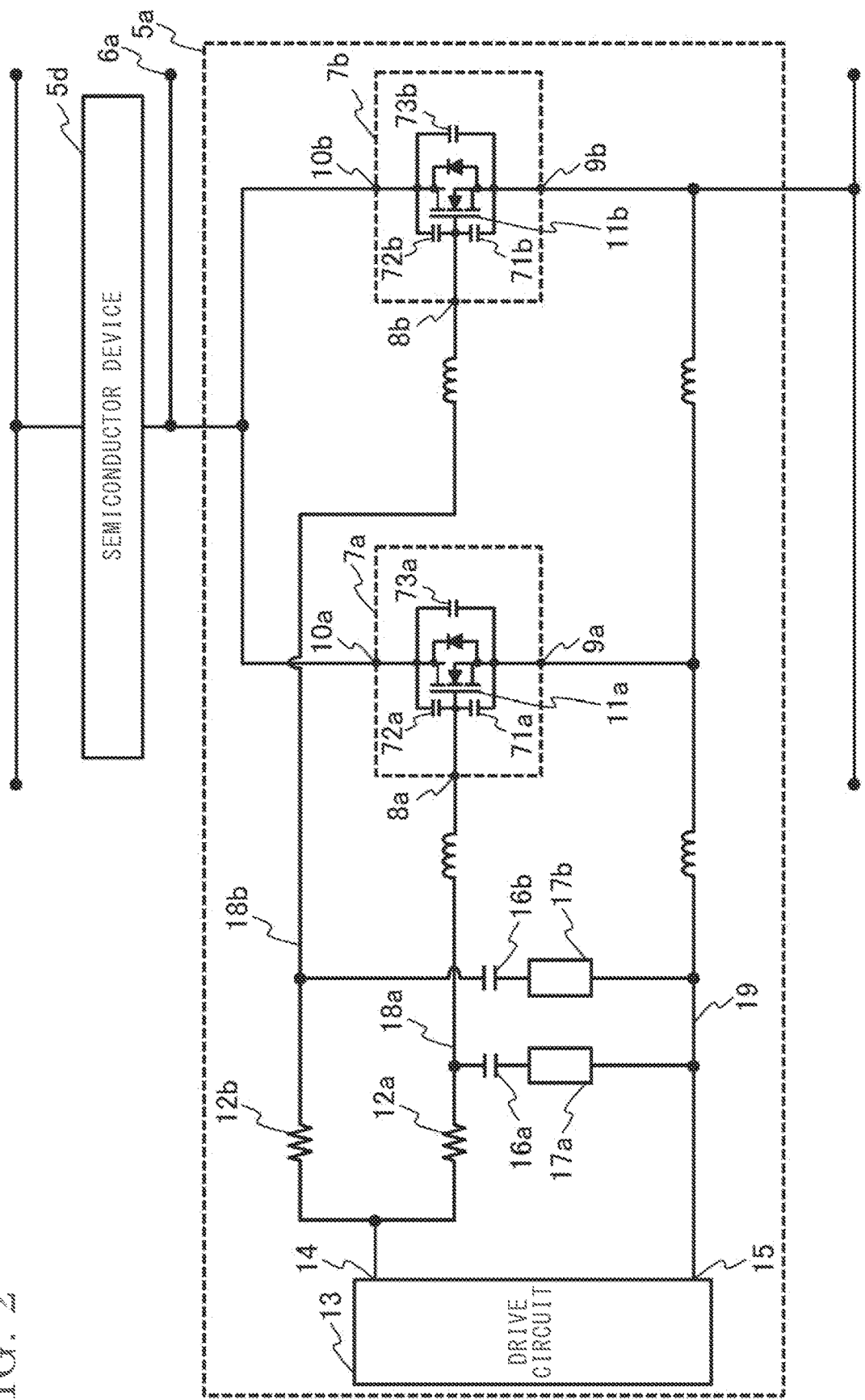
FIG. 2 is a circuit diagram of a semiconductor device in the first embodiment.

FIG. 2 is a circuit diagram of the semiconductor device 5a in the first embodiment. Three phases that form the power conversion apparatus in the first embodiment have configurations identical to one another, and a high-side arm and a low-side arm in each of the phases have the same configuration. Thus, the semiconductor device 5a of the low-side arm will be described.

The semiconductor device 5a is provided with: a first power module 7a including therein a first semiconductor switching element 11a; and a second power module 7b including therein a second semiconductor switching element 11b. The first power module 7a and the second power module 7b are connected in parallel. The first power module 7a has: a first control signal input terminal 8a as a gate terminal which receives a switching control signal; a first reference potential terminal 9a as a source terminal; and a drain terminal 10a connected to the power output node 6a. The second power module 7b has: a second control signal input terminal 8b as a gate terminal which receives a switching control signal; a second reference potential terminal 9b as a source terminal; and a drain terminal 10b connected to the power output node 6a. The first power module 7a and the second power module 7b form a pair and are simultaneously operated to output AC power to the same power output node 6a.

The first power module 7a and the second power module 7b are sealed with, for example, mold resin but may be sealed with gel or the like. Alternatively, two power modules of a 2-in-1-type each obtained by sealing a low-side arm and a high-side arm with mold resin in the same package may be used in a state of being connected in parallel. Also, although the power conversion apparatus in the first embodiment has a configuration in which two power modules are connected in parallel for each phase in order to output high power, the number of power modules connected in parallel may be changed according to the target output power.

The first semiconductor switching element 11a and the second semiconductor switching element 11b are semiconductor switching elements for power control, such as MOSFETs or IGBTs. The first semiconductor switching element 11a and the second semiconductor switching element 11b are not limited to these semiconductor switching elements and may be other semiconductor switching elements such as bipolar transistors. Regarding the first semiconductor switching element 11a and the second semiconductor switching element 11b, a configuration in which MOSFETs are used and parasitic diodes of the MOSFETs are used as flyback diodes is shown in FIG. 2. However, in the case of using switching elements having no parasitic diodes such as IGBTs, a configuration in which flyback diodes are connected in parallel may be employed.

The first semiconductor switching element 11a and the second semiconductor switching element 11b are each formed on a semiconductor substrate made from a material such as silicon, silicon carbide, or gallium nitride, and the first semiconductor switching element 11a and the second semiconductor switching element 11b may each be formed of a wide-bandgap semiconductor having a wider bandgap than silicon. A MOSFET formed of silicon carbide which is a wide-bandgap semiconductor has a high transconductance, can reduce loss at the time of conduction, and can reduce switching loss by increasing a temporal change amount di/dt of current generated at the time of switching. In general, electrical vibrations easily occur in such a semiconductor switching element having a high transconductance. Therefore, if a wide-bandgap semiconductor is applied to the semiconductor device in the first embodiment, the advantageousness of effects of the semiconductor device in the first embodiment is more prominently exhibited.

In addition, although the first power module 7a of the semiconductor device in the first embodiment has been described as being provided with one first semiconductor switching element 11a, one power module may be provided with two or more semiconductor switching elements in order to output high power according to the target output power. In a configuration in which two or more semiconductor switching elements are connected in parallel inside one power module, electrical vibrations might occur between the semiconductor switching elements, and a gate capacitor is sometimes used to suppress such electrical vibrations. Therefore, if the configuration in which two or more semiconductor switching elements are connected in parallel inside one power module is applied to the semiconductor device in the first embodiment, the advantageousness of the effects of the semiconductor device in the first embodiment is more prominently exhibited.

The first control signal input terminal 8a (gate terminal) of the first power module 7a is connected to one terminal of a first resistor 12a which is a gate resistor, and the other terminal of the first resistor 12a is connected to a gate voltage output terminal 14 of a drive circuit 13 which is a gate driver. That is, the one terminal of the first resistor 12a which is a gate resistor is connected to a gate node 18a, and the other terminal of the first resistor 12a is connected to the gate voltage output terminal 14 of the drive circuit 13. The second control signal input terminal 8b (gate terminal) of the second power module 7b is connected to one terminal of a second resistor 12b which is a gate resistor, and the other terminal of the second resistor 12b is connected to the gate voltage output terminal 14 of the drive circuit 13 which is a gate driver. That is, the one terminal of the second resistor 12b which is a gate resistor is connected to a gate node 18b, and the other terminal of the second resistor 12b is connected to the gate voltage output terminal 14 of the drive circuit 13. The drive circuit 13 outputs a switching control signal to the first control signal input terminal 8a of the first power module 7a via the first resistor 12a and outputs a switching control signal to the second control signal input terminal 8b of the second power module 7b via the second resistor 12b, to substantially simultaneously drive the first power module 7a and the second power module 7b. The first reference potential terminal 9a (source terminal) of the first power module 7a is connected to a source potential terminal 15 of the drive circuit 13 via a source wire, and the second reference potential terminal 9b (source terminal) of the second power module 7b is connected to the source potential terminal 15 of the drive circuit 13 via the source wire. If the first resistor 12a and the second resistor 12b which are gate resistors are connected in this manner, an effect of increasing the impedance between the first control signal input terminal 8a of the first power module 7a and the second control signal input terminal 8b of the second power module 7b is exhibited, and an effect of suppressing electrical vibrations between the first power module 7a and the second power module 7b is exhibited. Meanwhile, a configuration in which the first resistor 12a and the second resistor 12b are removed and a gate resistor is disposed between the gate voltage output terminal 14 and a node connecting the first control signal input terminal 8a of the first power module 7a and the second control signal input terminal 8b of the second power module 7b could lead to occurrence of electrical vibrations between the first power module 7a and the second power module 7b, and thus is not desirable.

A first capacitor 16a which is a gate capacitor, and a first filter 17a, are connected in series, one terminal of the first capacitor 16a is connected to the gate node 18a, and one terminal of the first filter 17a is connected to a source node 19. That is, the first capacitor 16a is connected between the first control signal input terminal 8a and the first reference potential terminal 9a, and the first filter 17a is connected in series to the first capacitor 16a. A second capacitor 16b which is a gate capacitor, and a second filter 17b, are connected in series, one terminal of the second capacitor 16b is connected to the gate node 18b, and one terminal of the second filter 17b is connected to the source node 19. That is, the second capacitor 16b is connected between the second control signal input terminal 8b and the second reference potential terminal 9b, and the second filter 17b is connected in series to the second capacitor 16b. The first filter 17a and the second filter 17b suppress electrical vibrations that occur on an inter-control terminal path extending from the first control signal input terminal 8a through the first capacitor 16a and the second capacitor 16b to the second control signal input terminal 8b. The first filter 17a and the second filter 17b each have a frequency characteristic that an impedance thereof increases as a frequency increases. Although two filters, i.e., the first filter 17a and the second filter 17b, are provided in the example shown in FIG. 2, it is also possible to provide only one of the first filter 17a and the second filter 17b, and, if the first filter 17a connected in series to the first capacitor 16a is provided on the inter-control terminal path extending from the first control signal input terminal 8a through the first capacitor 16a and the second capacitor 16b to the second control signal input terminal 8b, electrical vibrations that occur on the inter-control terminal path can be suppressed.

It is noted that, if a gate capacitor is connected between the gate voltage output terminal 14 and the source node 19 in the configuration with the first resistor 12a and the second resistor 12b which are gate resistors, the semiconductor device behaves as if no gate capacitor is connected. In such a state, the function of the gate capacitor, i.e., the function of reducing switching loss or suppressing a steep change in voltage by adjusting dv/dt, is not achieved.

Figure 3:
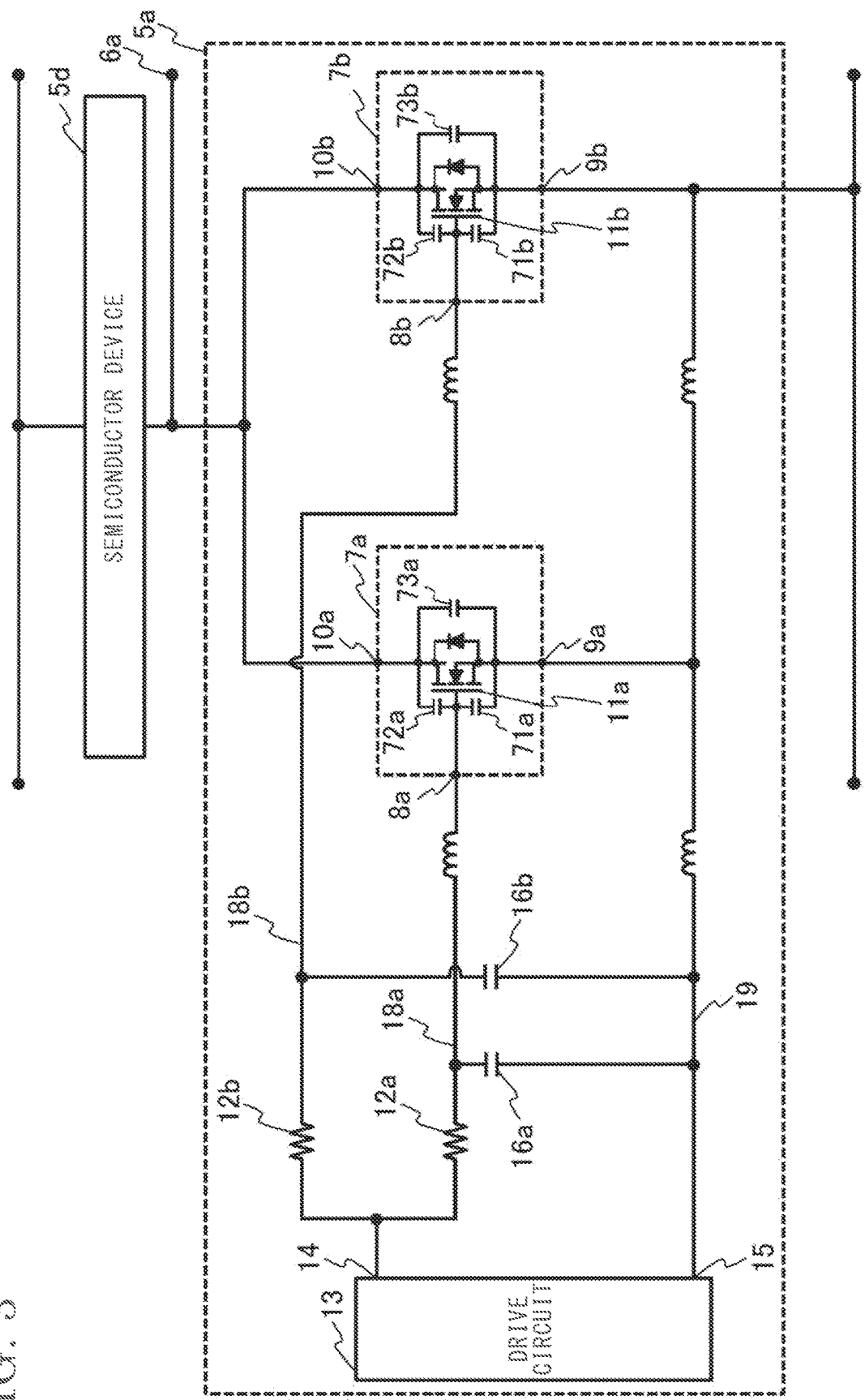
FIG. 3 is a circuit diagram of a semiconductor device in a comparative example.

FIG. 3 is a circuit diagram of a semiconductor device in a comparative example. In comparison between the semiconductor device in the comparative example in FIG. 3 and the semiconductor device 5a in the first embodiment in FIG. 2, the semiconductor device in the comparative example is provided with neither the first filter 17a nor the second filter 17b. The other constituents of the semiconductor device in the comparative example are the same as those of the semiconductor device 5a in the first embodiment.

In the semiconductor device in the comparative example shown in FIG. 3, electrical vibrations might occur on an inter-control terminal path that extends from the first control signal input terminal 8a of the first power module 7a through the gate node 18a and the first capacitor 16a to the source node 19 and that further extends from the source node 19 through the second capacitor 16b and the gate node 18b to the second control signal input terminal 8b of the second power module 7b. The reason for this is because, since impedances of the first capacitor 16a and the second capacitor 16b which are gate capacitors are low in a high frequency band, an impedance between the gate node 18a and the source node 19 and an impedance between the gate node 18b and the source node 19 decrease in a band of about ten-odd MHz to 200 MHZ, and electrical vibrations at about ten-odd MHz to 200 MHz easily occur on the inter-control terminal path. That is, in the semiconductor device in the first embodiment shown in FIG. 2, the frequency of electrical vibrations that occur on the inter-control terminal path owing to the first capacitor 16a, the second capacitor 16b, and wiring is, for example, ten-odd MHz to 200 MHz. Such electrical vibrations are a so-called inter-module resonance phenomenon in which electric charges are exchanged between the gates of the power modules. Such electrical vibrations are one of vibration phenomena that occur owing to a gate capacitor. In some cases, an erroneous operation of a switching element, breakage of the switching element due to exceeding of a withstand voltage thereof, or breakage of a part on a control board, might occur.

In the semiconductor device in the first embodiment shown in FIG. 2, the first filter 17a and the second filter 17b are provided. Thus, even though the first capacitor 16a and the second capacitor 16b which are gate capacitors are provided, the impedances of the inter-control terminal path can be set to be high in the band of about ten-odd MHz to 200 MHz including the frequency of electrical vibrations on the inter-control terminal path, whereby the electrical vibrations can be suppressed.

Figure 4:
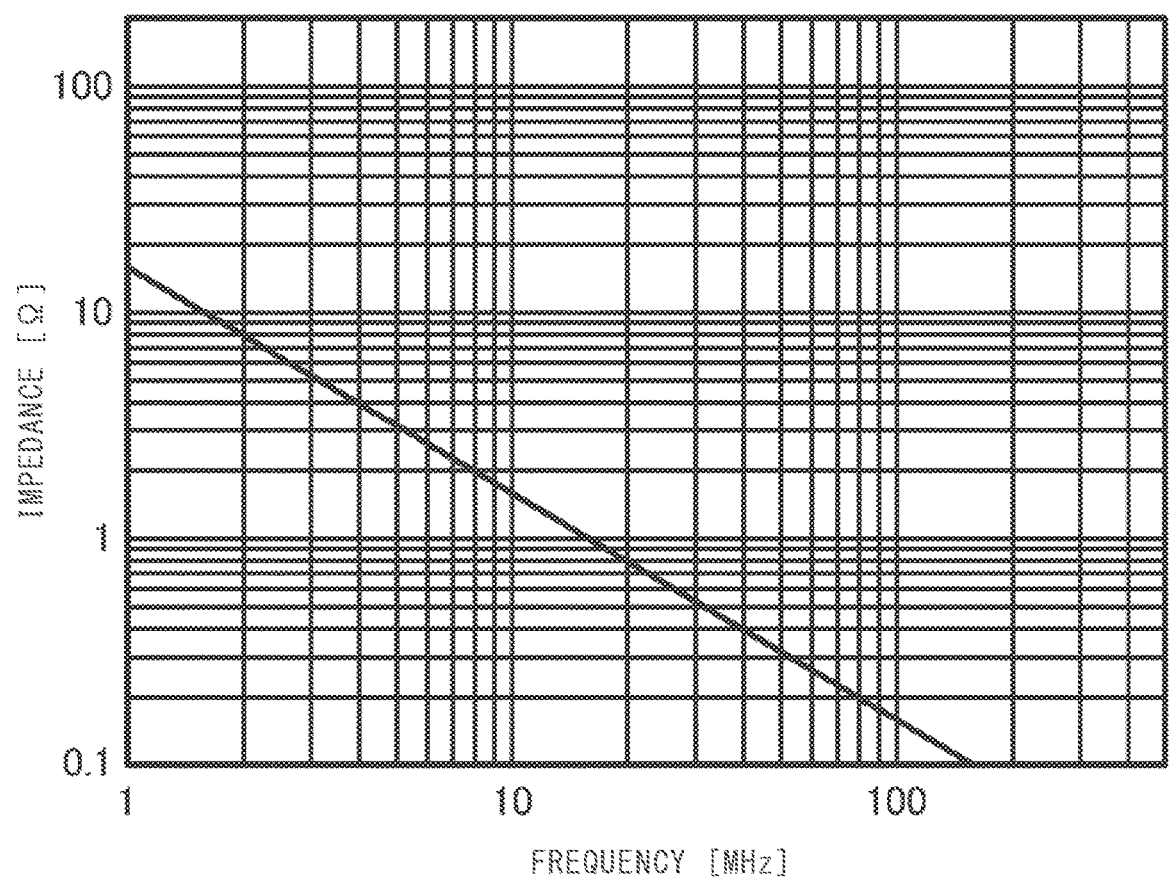
FIG. 4 shows a frequency characteristic of an impedance between a gate node and a source node in the semiconductor device in the comparative example.
Figure 5:
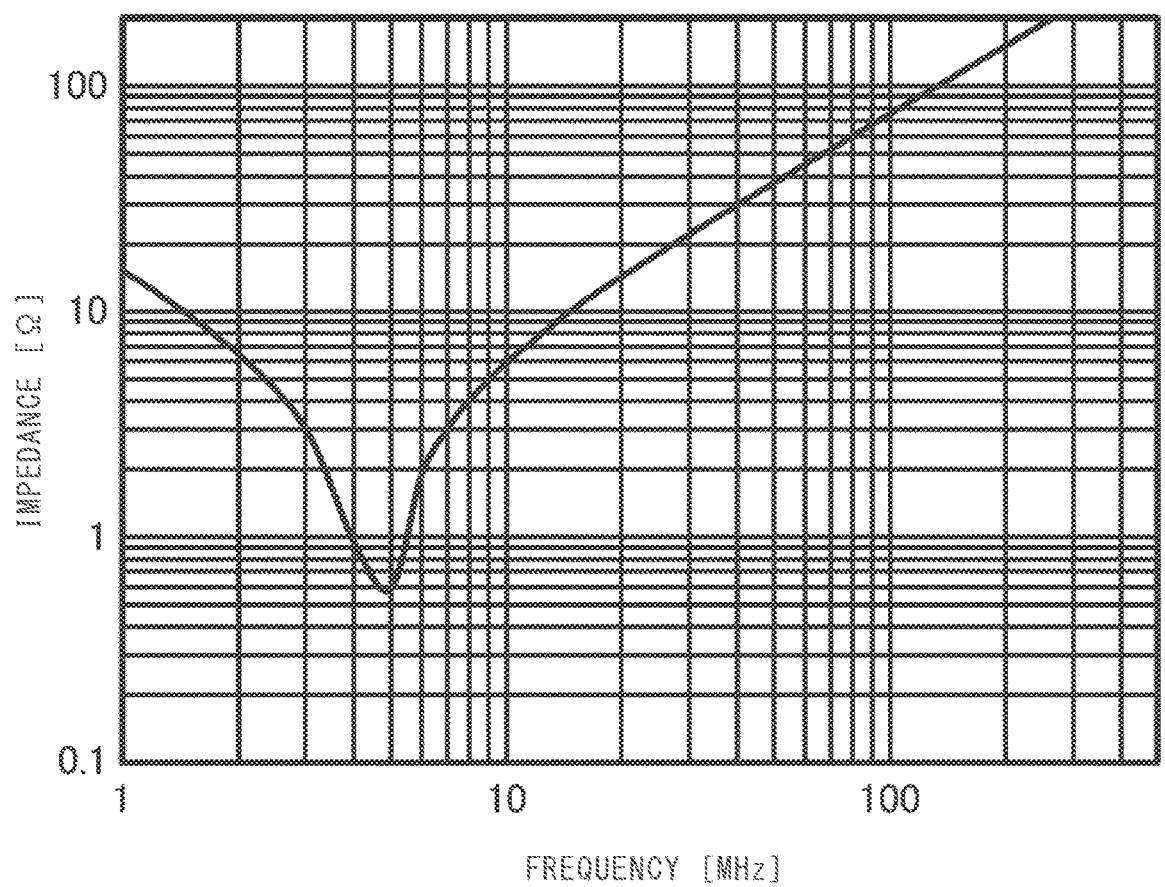
FIG. 5 shows a frequency characteristic of an impedance between a gate node and a source node in the semiconductor device in the first embodiment.

FIG. 4 shows a frequency characteristic of the impedance between the gate node 18a and the source node 19, which is also a frequency characteristic of the impedance between the gate node 18b and the source node 19, in the semiconductor device in the comparative example shown in FIG. 3. As the frequency increases, the impedance decreases. FIG. 5 shows a frequency characteristic of the impedance between the gate node 18a and the source node 19, which is also a frequency characteristic of the impedance between the gate node 18b and the source node 19, in the semiconductor device 5a in the first embodiment shown in FIG. 2. The impedance is high in the band of about ten-odd MHz to 200 MHz, and electrical vibrations in the band of about ten-odd MHz to 200 MHz are suppressed in the semiconductor device 5a in the first embodiment.

Regarding frequency characteristics of impedances of the first filter 17a and the second filter 17b, an impedance, of each of the first filter 17a and the second filter 17b, at around 0 Hz is desirably set to be lower than an impedance thereof in the band of about ten-odd MHz to 200 MHz as the frequency of electrical vibrations that occur on a path including the inter-control terminal path, so as not to hinder the roles of the first capacitor 16a and the second capacitor 16b which are gate capacitors. For example, the impedance, of each of the first filter 17a and the second filter 17b, at a frequency of not higher than 1 MHz is desirably lower than the impedance thereof at the frequency of electrical vibrations that occur on the path including the inter-control terminal path. The magnitude of the impedance, of the first filter 17a, at 0 Hz is desirably smaller than the resistance value of the first resistor 12a which is a gate resistor, and is desirably equal to or smaller than 1 ohm. The magnitude of the impedance, of the second filter 17b, at 0 Hz is desirably smaller than the resistance value of the second resistor 12b which is a gate resistor, and is desirably equal to or smaller than 1 ohm.

If the impedance, of each of the first filter 17a and the second filter 17b, at around 0 Hz is high, e.g., if the impedance, of each of the first filter 17a and the second filter 17b, at a frequency of not higher than 1 MHz is high, the first capacitor 16a and the second capacitor 16b which are gate capacitors are charged at reduced speeds, and the semiconductor device behaves as if the first capacitor 16a and the second capacitor 16b which are gate capacitors are not connected. In such a state, the function of each gate capacitor, i.e., the function of reducing switching loss or suppressing a steep change in voltage by adjusting dv/dt, is not achieved. Therefore, the impedance, of each of the first filter 17a and the second filter 17b, at around 0 Hz, e.g., the impedance, of each of the first filter 17a and the second filter 17b, at a frequency of not higher than 1 MHz, is preferably low. Further, if the magnitude of the impedance, of each of the first filter 17a and the second filter 17b, at 0 Hz is smaller than the resistance value of each of the first resistor 12a and the second resistor 12b which are gate resistors, the switching speeds of the first power module 7a and the second power module 7b are not influenced by manufacturing variations of the first filter 17a and the second filter 17b even in a case where tolerances such as manufacturing variations of resistance components in the first filter 17a and the second filter 17b are large.

The first filter 17a and the second filter 17b may each be a bead element represented by a surface-mountable ferrite bead. The bead element has a frequency characteristic that an impedance thereof becomes high in a high frequency band. If the bead element is used as each of the first filter 17a and the second filter 17b, the impedance between the gate node 18a and the source node 19 at ten-odd MHz to 200 MHz becomes high, and the impedance between the gate node 18b and the source node 19 at ten-odd MHz to 200 MHz becomes high, whereby electrical vibrations can be suppressed. As bead elements, ones that have various frequency characteristics regarding impedances are provided. Thus, even if the manner of mounting is changed and the frequency band of electrical vibrations is changed, selection of a bead element having an appropriate characteristic leads to increase in the impedance between the gate node 18a and the source node 19 and the impedance between the gate node 18b and the source node 19 in a desired frequency band, whereby the electrical vibrations can be suppressed.

Alternatively, the first filter 17a and the second filter 17b may each be a coil formed of a printed board wire. If the first filter 17a and the second filter 17b are each implemented by a coil formed of a printed board wire, the number of parts to be mounted can be decreased. The coil has a frequency characteristic that an impedance thereof increases as a further shift from a band of low frequencies of around 0 Hz to a band of high frequencies occurs. Thus, the impedance increases in the frequency band of electrical vibrations, whereby the vibrations can be suppressed.

As described above, the semiconductor device in the first embodiment includes: the drive circuit 13 which outputs a switching control signal from the gate voltage output terminal 14 thereof; the first power module 7a including therein the first semiconductor switching element 11a and having the first reference potential terminal 9a and the first control signal input terminal 8a which receives the switching control signal; the second power module 7b including therein the second semiconductor switching element 11b and connected in parallel to the first power module 7a, the second power module 7b having the second reference potential terminal 9b and the second control signal input terminal 8b which receives the switching control signal; the first resistor 12a connected between the gate voltage output terminal 14 and the first control signal input terminal 8a; the second resistor 12b connected between the gate voltage output terminal 14 and the second control signal input terminal 8b; the first capacitor 16a connected between the first control signal input terminal 8a and the first reference potential terminal 9a; the second capacitor 16b connected between the second control signal input terminal 8b and the second reference potential terminal 9b; and the first filter 17a connected in series to the first capacitor 16a, on the inter-control terminal path extending from the first control signal input terminal 8a through the first capacitor 16a and the second capacitor 16b to the second control signal input terminal 8b, wherein the first filter 17a has a frequency characteristic that an impedance thereof increases as a frequency increases. Thus, the semiconductor device can suppress, with a simple additional circuit, electrical vibrations occurring by an included gate capacitor.

Second Embodiment

Figure 6:
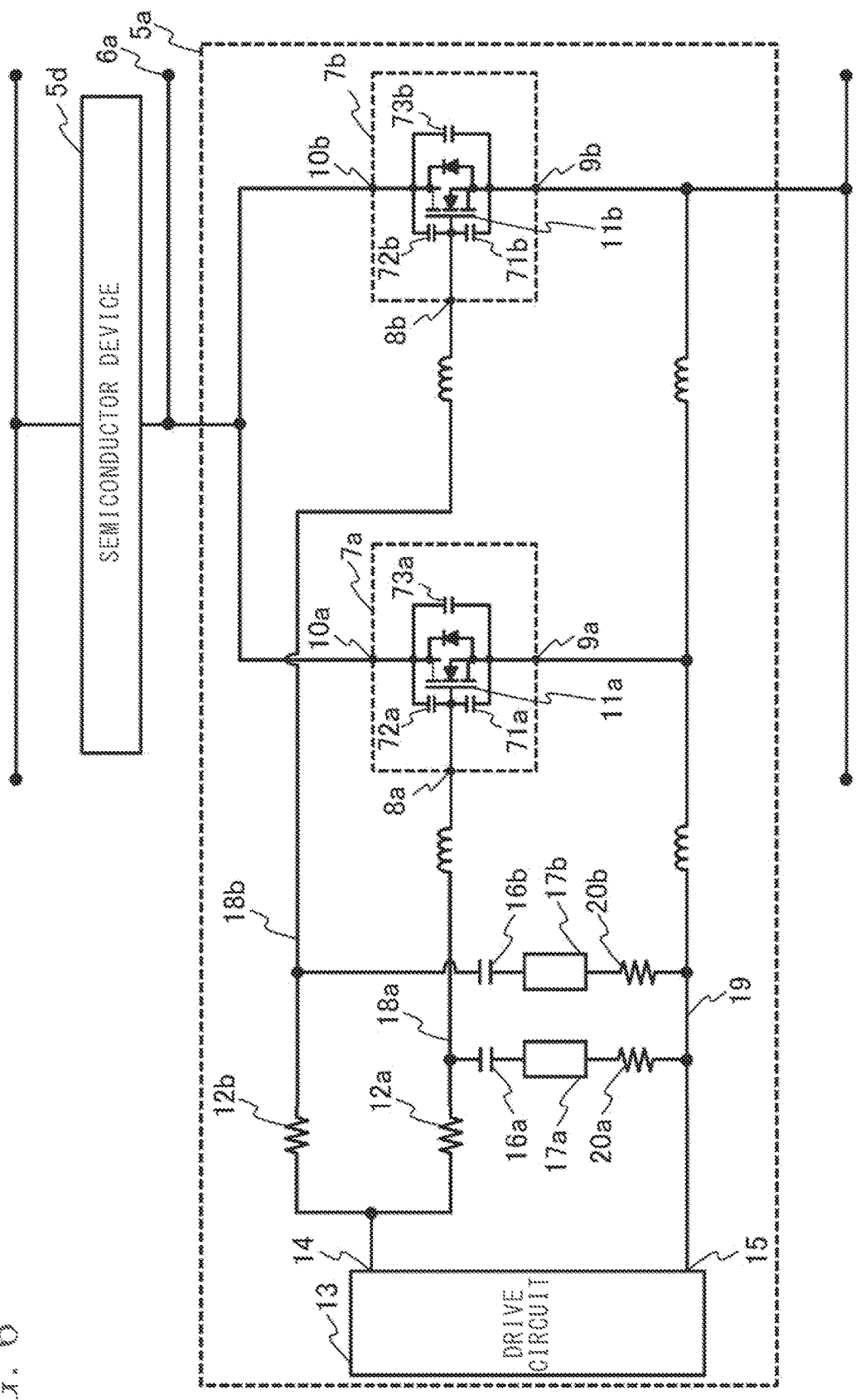
FIG. 6 is a circuit diagram of a semiconductor device in a second embodiment.

FIG. 6 is a circuit diagram of a semiconductor device 5a in a second embodiment. In comparison of the circuit diagram of the semiconductor device 5a in the second embodiment shown in FIG. 6 with the circuit diagram of the semiconductor device 5a in the first embodiment shown in FIG. 2, a third resistor 20a and a fourth resistor 20b are added. The other constituents of the semiconductor device in the second embodiment are the same as those of the semiconductor device in the first embodiment.

The third resistor 20a is connected in series to the first capacitor 16a, on a first loop path extending from the first control signal input terminal 8a through the first capacitor 16a to the first reference potential terminal 9a. In FIG. 6, the third resistor 20a is connected between the first filter 17a and the source node 19. The fourth resistor 20b is connected in series to the second capacitor 16b, on a second loop path extending from the second control signal input terminal 8b through the second capacitor 16b to the second reference potential terminal 9b. In FIG. 6, the fourth resistor 20b is connected between the second filter 17b and the source node 19. In general, a power module has parasitic capacitances. The first power module 7a has: a parasitic capacitance 71a which is a gate-source parasitic capacitance Cgs between the first control signal input terminal 8a as a gate terminal and the first reference potential terminal 9a as a source terminal; a parasitic capacitance 72a which is a gate-drain parasitic capacitance Cgd between the first control signal input terminal 8a as a gate terminal and the drain terminal 10a; and a parasitic capacitance 73a which is a drain-source parasitic capacitance Cds between the drain terminal 10a and the first reference potential terminal 9a as a source terminal. Likewise, the second power module 7b has a parasitic capacitance 71b, a parasitic capacitance 72b, and a parasitic capacitance 73b. For example, in the semiconductor device in the comparative example shown in FIG. 3, the first capacitor 16a which is a gate capacitor is connected between the first control signal input terminal 8a and the first reference potential terminal 9a, whereby a first loop path that extends from the first capacitor 16a through the gate node 18a so as to enter the first control signal input terminal 8a and that further extends via the parasitic capacitance 71a through the first reference potential terminal 9a and the source node 19 so as to return to the first capacitor 16a is formed. On the first loop path, LC resonance which is electrical vibrations occurs. If LC resonance occurs owing to connection of the gate capacitor, the voltage between the first control signal input terminal 8a as a gate terminal and the first reference potential terminal 9a as a source terminal in the first power module 7a vibrates. Owing to this, current between the drain terminal 10a and the first reference potential terminal 9a vibrates. Consequently, a steep change in current might occur. If a surge caused by such a steep change in current takes a value higher than the withstand voltage of the semiconductor switching element, the semiconductor switching element might be broken.

If the third resistor 20a is connected in series to the first capacitor 16a, on the first loop path extending from the first control signal input terminal 8a through the first capacitor 16a to the first reference potential terminal 9a, as in the semiconductor device in the second embodiment shown in FIG. 6, LC resonance superimposed on gate-source current flowing through the parasitic capacitance 71a of the first power module 7a can be suppressed. As a result, LC resonance superimposed on the gate-source voltage of the first power module 7a can be suppressed, whereby the corresponding semiconductor switching element can be prevented from being broken. With the fourth resistor 20b as well, LC resonance superimposed on the gate-source voltage of the second power module 7b can be suppressed, whereby the corresponding semiconductor switching element can be prevented from being broken.

Figure 7:
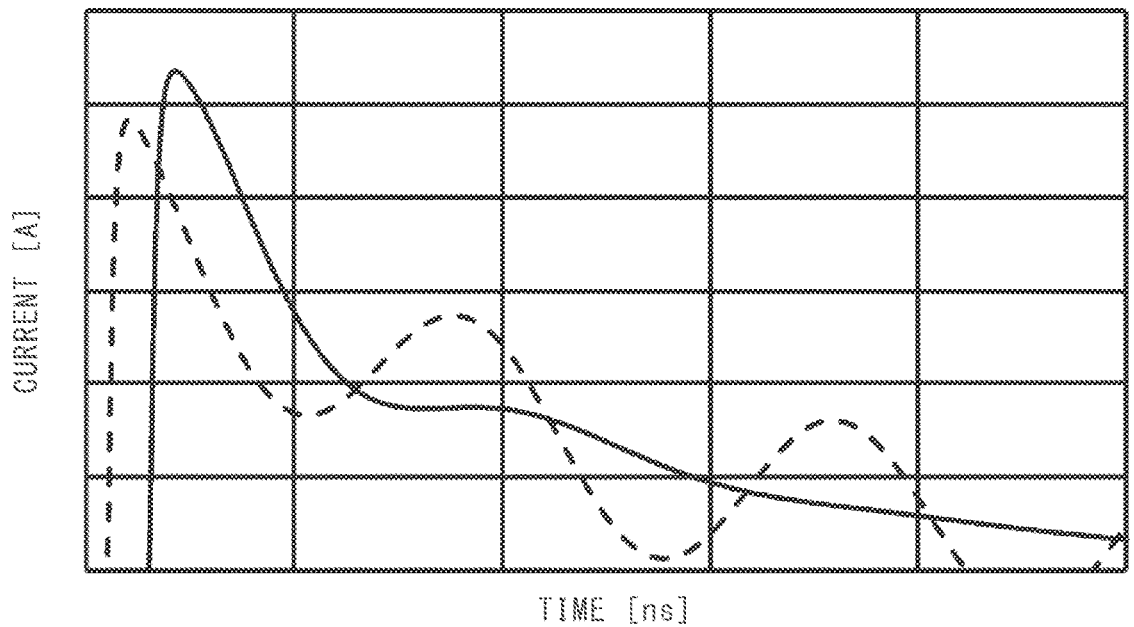
FIG. 7 shows temporal changes in gate-source currents of power modules.
Figure 8:
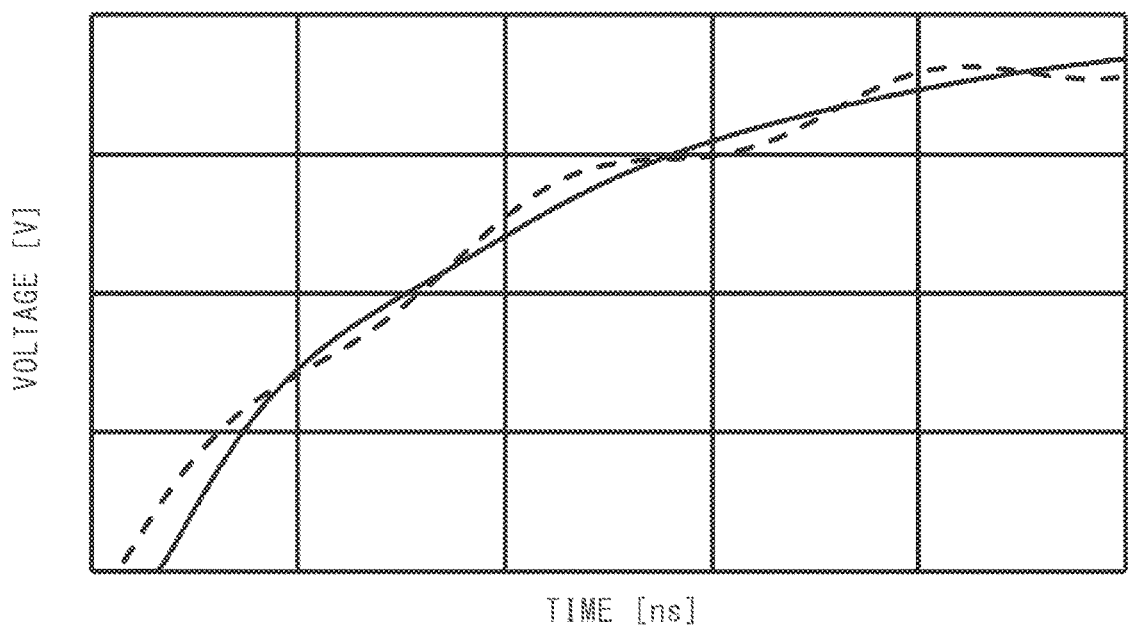
FIG. 8 shows temporal changes in gate-source voltages of the power modules.

FIG. 7 shows temporal changes in currents that are each a gate-source current between the first control signal input terminal 8a and the first reference potential terminal 9a of a corresponding one of first power modules 7a. The broken line indicates temporal change in the gate-source current of the first power module 7a in the comparative example shown in FIG. 3, and the solid line indicates temporal change in the gate-source current of the first power module 7a in the second embodiment shown in FIG. 6. Regarding the gate-source current in the comparative example indicated by the broken line, LC resonance due to mounting of the gate capacitor has occurred. Meanwhile, regarding the gate-source current in the second embodiment indicated by the solid line, the LC resonance is suppressed. FIG. 8 shows temporal changes in voltages that are each a gate-source voltage between the first control signal input terminal 8a and the first reference potential terminal 9a of a corresponding one of the first power modules 7a. The broken line indicates temporal change in the gate-source voltage of the first power module 7a in the comparative example shown in FIG. 3, and the solid line indicates temporal change in the gate-source voltage of the first power module 7a in the second embodiment shown in FIG. 6. Regarding the gate-source voltage in the comparative example indicated by the broken line, LC resonance due to mounting of the gate capacitor has occurred. Meanwhile, regarding the gate-source voltage in the second embodiment indicated by the solid line, the LC resonance is suppressed.

Although mounting is facilitated by connecting the third resistor 20a between the first filter 17a and the source node 19 and connecting the fourth resistor 20b between the second filter 17b and the source node 19 in the semiconductor device in the second embodiment shown in FIG. 6, the same advantageous effect of suppressing LC resonance which is electrical vibrations can be obtained as long as: the third resistor 20a is connected in series to the first capacitor 16a, on the first loop path extending from the first control signal input terminal 8a through the first capacitor 16a to the first reference potential terminal 9a; and the fourth resistor 20b is connected in series to the second capacitor 16b, on the second loop path extending from the second control signal input terminal 8b through the second capacitor 16b to the second reference potential terminal 9b.

It is noted that, if a value larger than 1 ohm and smaller than the resistance value of the first resistor 12a which is a gate resistor is selected as the resistance value of the third resistor 20a, the first filter 17a can suppress LC resonance which is electrical vibrations without hindering the role of the first capacitor 16a which is a gate capacitor. Likewise, if a value larger than 1 ohm and smaller than the resistance value of the second resistor 12b which is a gate resistor is selected as the resistance value of the fourth resistor 20b, the second filter 17b can suppress LC resonance which is electrical vibrations without hindering the role of the second capacitor 16b which is a gate capacitor.

Figure 9:
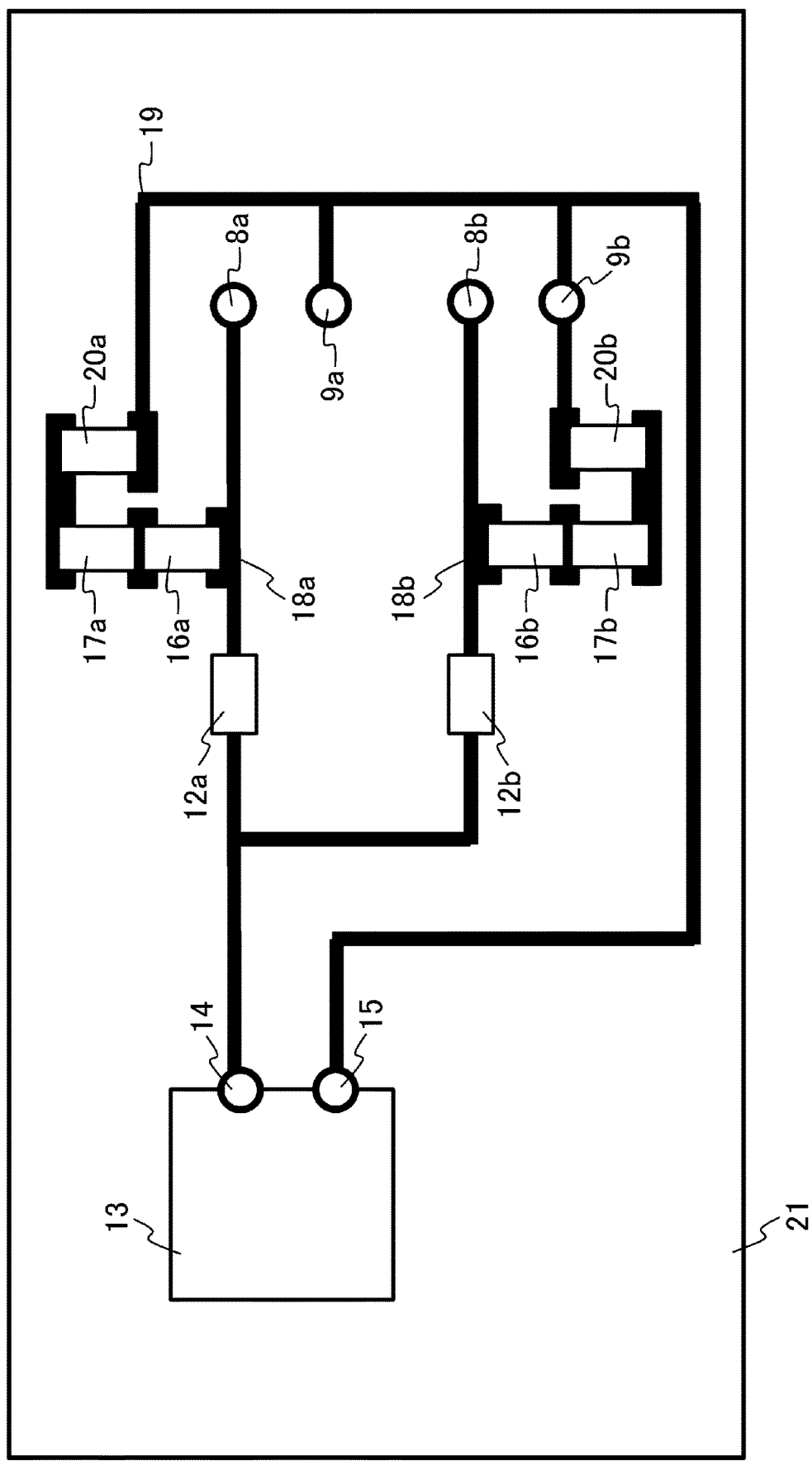
FIG. 9 shows an example in which the semiconductor device in the second embodiment is disposed on a board.

FIG. 9 shows an example in which the semiconductor device 5a in the second embodiment shown in FIG. 6 is disposed on a board. FIG. 9 shows a situation in which the drive circuit 13, the first resistor 12a, the second resistor 12b, the first capacitor 16a, the first filter 17a, the third resistor 20a, the second capacitor 16b, the second filter 17b, and the fourth resistor 20b are disposed on a board 21. The first resistor 12a, the second resistor 12b, the first filter 17a, the second filter 17b, the third resistor 20a, the fourth resistor 20b, the first capacitor 16a, the second capacitor 16b, and the drive circuit 13 may be mounted on one board as shown in FIG. 9. The first filter 17a, the second filter 17b, the third resistor 20a, the fourth resistor 20b, the first capacitor 16a, and the second capacitor 16b can easily be implemented by surface-mountable elements. For example, if the first filter 17a and the second filter 17b are implemented by chip bead elements, the third resistor 20a and the fourth resistor 20b are implemented by chip resistor elements, and the first capacitor 16a and the second capacitor 16b are implemented by chip capacitor elements, these elements can easily be mounted on the same board as that for the drive circuit 13, and an additional space does not need to be prepared, whereby the semiconductor device can be prevented from being upsized owing to addition of the function of suppressing electrical vibrations.

Figure 10:
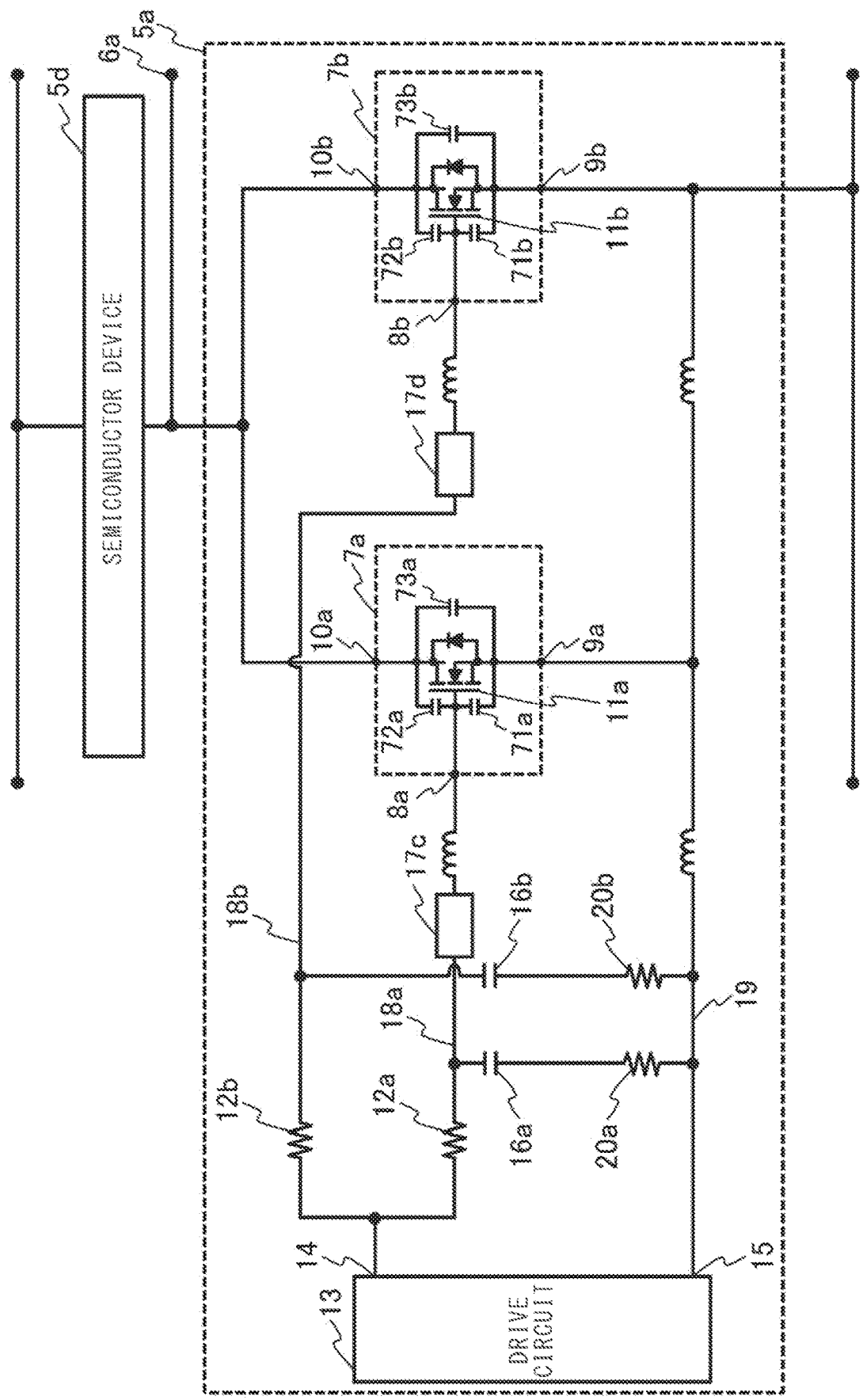
FIG. 10 is a circuit diagram of a modification of the semiconductor device in the second embodiment.

FIG. 10 is a circuit diagram of a modification of the semiconductor device 5a in the second embodiment. In comparison of the circuit diagram of the modification of the semiconductor device 5a in the second embodiment shown in FIG. 10 with the circuit diagram of the semiconductor device 5a in the second embodiment shown in FIG. 6, these circuit diagrams are different from each other in terms of the connection positions of the first filter and the second filter. Specifically, in the modification shown in FIG. 10, a first filter 17c is connected between the gate node 18a and the first control signal input terminal 8a of the first power module 7a, and a second filter 17d is connected between the gate node 18b and the second control signal input terminal 8b of the second power module 7b. That is, the first filter 17c is connected between the first capacitor 16a and the first control signal input terminal 8a of the first power module 7a, and the second filter 17d is connected between the second capacitor 16b and the second control signal input terminal 8b of the second power module 7b. At the frequency of electrical vibrations on the inter-control terminal path, an impedance between the first power module 7a and the gate node 18a increases, and an impedance between the second power module 7b and the gate node 18b increases, whereby electrical vibrations can be suppressed also in the modification of the semiconductor device 5a shown in FIG. 10. In an actual circuit, the circuit that more prominently exhibits the advantageous effect may be selected from between the circuit of the semiconductor device shown in FIG. 6 and the circuit of the semiconductor device shown in FIG. 10. Also, a first filter may be disposed at each of both the position of the first filter 17a shown in FIG. 6 and the position of the first filter 17c shown in FIG. 10, and a second filter may be disposed at each of both the position of the second filter 17b shown in FIG. 6 and the position of the second filter 17d shown in FIG. 10.

Third Embodiment

Figure 11:
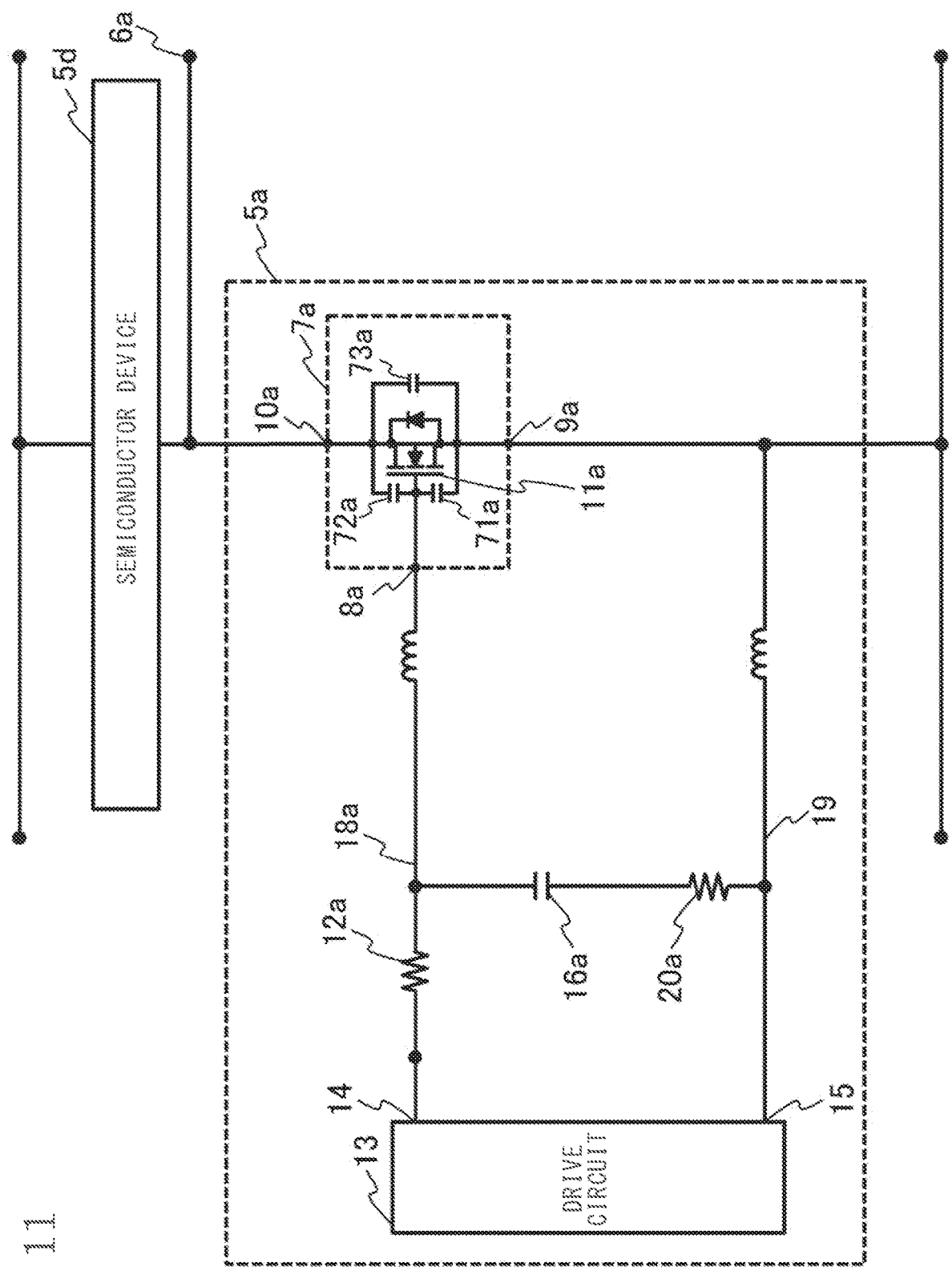
FIG. 11 is a circuit diagram of a semiconductor device in a third embodiment.

FIG. 11 is a circuit diagram of a semiconductor device 5a in a third embodiment. The semiconductor device 5a in the third embodiment is provided with only the first power module 7a, i.e., one power module. Similar to the semiconductor device 5a in the second embodiment shown in FIG. 6, the first resistor 12a is connected between the gate voltage output terminal 14 of the drive circuit 13 and the first control signal input terminal 8a, the first capacitor 16a is connected between the first control signal input terminal 8a and the first reference potential terminal 9a, and the third resistor 20a is connected in series to the first capacitor 16a, on the first loop path extending from the first control signal input terminal 8a through the first capacitor 16a to the first reference potential terminal 9a.

In each of the first embodiment and the second embodiment, a semiconductor device provided with two power modules, i.e., the first power module 7a and the second power module 7b, has been described. However, if the semiconductor device is provided with only the first power module 7a, i.e., one power module, electrical vibrations between power modules do not occur, and thus a configuration in which the first filter 17a is not provided may be employed as shown in FIG. 11. In the semiconductor device 5a in the third embodiment shown in FIG. 11 as well, it is possible to suppress, with the third resistor 20a, LC resonance as electrical vibrations having occurred on the first loop path that extends from the first capacitor 16a through the gate node 18a so as to enter the first control signal input terminal 8a and that further extends via the parasitic capacitance 71a through the first reference potential terminal 9a and the source node 19 so as to return to the first capacitor 16a.

Regarding each of the parts composing the semiconductor device 5a in the third embodiment, deformation, setting of numerical values, mounting, and selection of parts can be performed in the same manner as that for the semiconductor device 5a in the first embodiment or the second embodiment. For example, the resistance value of the third resistor 20a is desirably smaller than the resistance value of the first resistor 12a and larger than 1 ohm. Also, the first semiconductor switching element 11a may be formed of a wide-bandgap semiconductor. Further, the first resistor 12a, the third resistor 20a, the first capacitor 16a, and the drive circuit 13 may be mounted on one board.

Although the disclosure is described above in terms of various exemplary embodiments, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

Hereinafter, modes of the present disclosure are summarized as additional notes.

(Additional Note 1)

A semiconductor device comprising:
a drive circuit which outputs a switching control signal from a gate voltage output terminal thereof;
a first power module including therein a first semiconductor switching element and having a first reference potential terminal and a first control signal input terminal which receives the switching control signal;
a second power module including therein a second semiconductor switching element and connected in parallel to the first power module, the second power module having a second reference potential terminal and a second control signal input terminal which receives the switching control signal;
a first resistor connected between the gate voltage output terminal and the first control signal input terminal;
a second resistor connected between the gate voltage output terminal and the second control signal input terminal;
a first capacitor connected between the first control signal input terminal and the first reference potential terminal;
a second capacitor connected between the second control signal input terminal and the second reference potential terminal; and
a first filter connected in series to the first capacitor, on an inter-control terminal path extending from the first control signal input terminal through the first capacitor and the second capacitor to the second control signal input terminal, wherein
the first filter has a frequency characteristic that an impedance thereof increases as a frequency increases.

(Additional Note 2)

The semiconductor device according to additional note 1, further comprising
a second filter connected in series to the second capacitor, between the second control signal input terminal and the second reference potential terminal, the second filter having a frequency characteristic that an impedance thereof increases as the frequency increases, wherein
the first filter is connected in series to the first capacitor, between the first control signal input terminal and the first reference potential terminal.

(Additional Note 3)

The semiconductor device according to additional note 2, wherein
an impedance, of each of the first filter and the second filter, at a frequency of not higher than 1 MHz is lower than an impedance thereof at a frequency of electrical vibrations that occur on a path including the inter-control terminal path.

(Additional Note 4)

The semiconductor device according to additional note 2 or 3, wherein
a magnitude of an impedance, of the first filter, at 0 Hz is smaller than a resistance value of the first resistor, and
a magnitude of an impedance, of the second filter, at 0 Hz is smaller than a resistance value of the second resistor.

(Additional Note 5)

The semiconductor device according to any one of additional notes 2 to 4, wherein an impedance, of each of the first filter and the second filter, at 0 Hz is equal to or lower than 1 ohm.

(Additional Note 6)

The semiconductor device according to any one of additional notes 2 to 5, wherein
each of the first filter and the second filter is a bead element.

(Additional Note 7)

The semiconductor device according to any one of additional notes 2 to 5, wherein
each of the first filter and the second filter is a coil formed of a printed board wire.

(Additional Note 8)

The semiconductor device according to any one of additional notes 1 to 7, further comprising:
a third resistor connected in series to the first capacitor, on a first loop path extending from the first control signal input terminal through the first capacitor to the first reference potential terminal; and
a fourth resistor connected in series to the second capacitor, on a second loop path extending from the second control signal input terminal through the second capacitor to the second reference potential terminal.

(Additional Note 9)

The semiconductor device according to additional note 8, wherein
a resistance value of the third resistor is smaller than a resistance value of the first resistor, and
a resistance value of the fourth resistor is smaller than a resistance value of the second resistor.

(Additional Note 10)

The semiconductor device according to additional note 9, wherein
the resistance values of the third resistor and the fourth resistor are larger than 1 ohm.

(Additional Note 11)

The semiconductor device according to any one of additional notes 1 to 10, wherein
each of the first semiconductor switching element and the second semiconductor switching element is formed of a wide-bandgap semiconductor.

(Additional Note 12)

The semiconductor device according to any one of additional notes 2 to 7, wherein
the first filter, the second filter, the drive circuit, the first resistor, the second resistor, the first capacitor, and the second capacitor are mounted on one board.

(Additional Note 13)

A semiconductor device comprising:
a drive circuit which outputs a switching control signal from a gate voltage output terminal thereof;
a first power module including therein a first semiconductor switching element and having a first reference potential terminal and a first control signal input terminal which receives the switching control signal;
a first resistor connected between the gate voltage output terminal and the first control signal input terminal;
a first capacitor connected between the first control signal input terminal and the first reference potential terminal; and
a third resistor connected in series to the first capacitor, on a first loop path extending from the first control signal input terminal through the first capacitor to the first reference potential terminal.

(Additional Note 14)

The semiconductor device according to additional note 13, wherein a resistance value of the third resistor is smaller than a resistance value of the first resistor.
(Additional Note 15)
The semiconductor device according to additional note 14, wherein
the resistance value of the third resistor is larger than 1 ohm.
(Additional Note 16)
The semiconductor device according to any one of additional notes 13 to 15, wherein
the first semiconductor switching element is formed of a wide-bandgap semiconductor.
(Additional Note 17)
The semiconductor device according to any one of additional notes 13 to 16, wherein
the drive circuit, the first resistor, and the first capacitor are mounted on one board.

DESCRIPTION OF THE REFERENCE CHARACTERS 1 inverter circuit
2 DC power supply
3 motor
4 smoothing capacitor
5a, 5b, 5c, 5d, 5e, 5f semiconductor device
6a, 6b, 6c power output node
7a first power module
7b second power module
8a first control signal input terminal
8b second control signal input terminal
9a first reference potential terminal
9b second reference potential terminal
10a, 10b drain terminal
11a first semiconductor switching element
11b second semiconductor switching element
12a first resistor
12b second resistor
13 drive circuit
14 gate voltage output terminal
15 source potential terminal
16a first capacitor
16b second capacitor
17a first filter
17b second filter
17c first filter
17d second filter
18a, 18b gate node
19 source node
20a third resistor
20b fourth resistor
21 board
71a, 71b, 72a, 72b, 73a, 73b parasitic capacitance

What is claimed is:

1. A semiconductor device comprising:
a drive circuit which outputs a switching control signal from a gate voltage output terminal thereof;
a first power module including therein a first semiconductor switching element and having a first reference potential terminal and a first control signal input terminal which receives the switching control signal;
a second power module including therein a second semiconductor switching element and connected in parallel to the first power module, the second power module having a second reference potential terminal and a second control signal input terminal which receives the switching control signal;
a first resistor connected between the gate voltage output terminal and the first control signal input terminal;
a second resistor connected between the gate voltage output terminal and the second control signal input terminal;
a first capacitor connected between the first control signal input terminal and the first reference potential terminal;
a second capacitor connected between the second control signal input terminal and the second reference potential terminal; and
a first filter connected in series to the first capacitor, on an inter-control terminal path extending from the first control signal input terminal through the first capacitor and the second capacitor to the second control signal input terminal, wherein
the first filter has a frequency characteristic that an impedance thereof increases as a frequency increases.

2. The semiconductor device according to claim 1, further comprising
a second filter connected in series to the second capacitor, between the second control signal input terminal and the second reference potential terminal, the second filter having a frequency characteristic that an impedance thereof increases as the frequency increases, wherein
the first filter is connected in series to the first capacitor, between the first control signal input terminal and the first reference potential terminal.

3. The semiconductor device according to claim 2, wherein
an impedance, of each of the first filter and the second filter, at a frequency of not higher than 1 MHz is lower than an impedance thereof at a frequency of electrical vibrations that occur on a path including the inter-control terminal path.

4. The semiconductor device according to claim 2, wherein
a magnitude of an impedance, of the first filter, at 0 Hz is smaller than a resistance value of the first resistor, and
a magnitude of an impedance, of the second filter, at 0 Hz is smaller than a resistance value of the second resistor.

5. The semiconductor device according to claim 2, wherein
an impedance, of each of the first filter and the second filter, at 0 Hz is equal to or lower than 1 ohm.

6. The semiconductor device according to claim 2, wherein
each of the first filter and the second filter is a bead element.

7. The semiconductor device according to claim 2, wherein
each of the first filter and the second filter is a coil formed of a printed board wire.

8. The semiconductor device according to claim 1, further comprising:
a third resistor connected in series to the first capacitor, on a first loop path extending from the first control signal input terminal through the first capacitor to the first reference potential terminal; and
a fourth resistor connected in series to the second capacitor, on a second loop path extending from the second control signal input terminal through the second capacitor to the second reference potential terminal.

9. The semiconductor device according to claim 8, wherein
a resistance value of the third resistor is smaller than a resistance value of the first resistor, and a resistance value of the fourth resistor is smaller than a resistance value of the second resistor.

10. The semiconductor device according to claim 9, wherein
the resistance values of the third resistor and the fourth resistor are larger than 1 ohm.

11. The semiconductor device according to claim 1, wherein
each of the first semiconductor switching element and the second semiconductor switching element is formed of a wide-bandgap semiconductor.

12. The semiconductor device according to claim 2, wherein
the first filter, the second filter, the drive circuit, the first resistor, the second resistor, the first capacitor, and the second capacitor are mounted on one board.

13. A semiconductor device comprising:
a drive circuit which outputs a switching control signal from a gate voltage output terminal thereof;
a first power module including therein a first semiconductor switching element and having a first reference potential terminal and a first control signal input terminal which receives the switching control signal;
a first resistor connected between the gate voltage output terminal and the first control signal input terminal;
a first capacitor connected between the first control signal input terminal and the first reference potential terminal;
a second resistor connected in series to the first capacitor, on a first loop path extending from the first control signal input terminal through the first capacitor to the first reference potential terminal; and
a filter connected in series with the first capacitor and the second resistor in the first loop path, wherein an impedance of the filter increases with frequency.

14. The semiconductor device according to claim 13, wherein
a resistance value of the second resistor is smaller than a resistance value of the first resistor.

15. The semiconductor device according to claim 14, wherein
the resistance value of the second resistor is larger than 1 ohm.

16. The semiconductor device according to claim 13, wherein
the first semiconductor switching element is formed of a wide-bandgap semiconductor.

17. The semiconductor device according to claim 13, wherein
the drive circuit, the first resistor, and the first capacitor are mounted on one board.

18. The semiconductor device according to claim 13, wherein the filter is a chip bead element.

* * * * *